United States Patent
Teramoto et al.

(10) Patent No.: US 11,538,672 B2
(45) Date of Patent: Dec. 27, 2022

(54) INDUCTIVELY COUPLED PLASMA SPECTROMETRIC SYSTEM AND INDUCTIVELY COUPLED PLASMA SPECTROMETRIC METHOD

(71) Applicant: NATIONAL INSTITUTE OF ADVANCED INDUSTRIAL SCIENCE AND TECHNOLOGY, Tokyo (JP)

(72) Inventors: Yoshiyuki Teramoto, Ibaraki (JP); Akihiro Wakisaka, Ibaraki (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 0 days.

(21) Appl. No.: 17/282,381

(22) PCT Filed: Nov. 1, 2019

(86) PCT No.: PCT/JP2019/043001
§ 371 (c)(1),
(2) Date: Apr. 1, 2021

(87) PCT Pub. No.: WO2020/148970
PCT Pub. Date: Jul. 23, 2020

(65) Prior Publication Data
US 2021/0272784 A1    Sep. 2, 2021

(30) Foreign Application Priority Data
Jan. 18, 2019    (JP) .............................. JP2019-007363

(51) Int. Cl.
*H01J 37/32* (2006.01)
*G01N 21/73* (2006.01)
*G01J 3/443* (2006.01)

(52) U.S. Cl.
CPC ......... *H01J 37/32972* (2013.01); *G01J 3/443* (2013.01); *G01N 21/73* (2013.01); *H01J 37/32963* (2013.01)

(58) Field of Classification Search
CPC .......... H01J 37/32972; H01J 37/32963; G01J 3/443; G01N 21/73
See application file for complete search history.

(56) References Cited

U.S. PATENT DOCUMENTS 9,177,772 B1    11/2015    Wiederin et al.
2002/0005949 A1    1/2002    Uemura
(Continued)

FOREIGN PATENT DOCUMENTS

CN    109142253 A    * 1/2019    ............. G01N 21/31
JP    S62282247       12/1987
(Continued)

OTHER PUBLICATIONS

WIPO, International Search Report for PCT/JP2019/043001, dated Jan. 28, 2020.

*Primary Examiner* — Jamil Ahmed
(74) *Attorney, Agent, or Firm* — Hodgson Russ LLP

(57) ABSTRACT

Provided is an inductively coupled plasma spectrometric system for measuring an emission state of plasma into which a measurement target sample is fed, the inductively coupled plasma spectrometric system including: a spectrometer configured to resolve light emitted in a measurement region set in the plasma into a plurality of wavelength components; a detection device configured to detect a spatial distribution of the resolved light; and a measuring device configured to measure the detected spatial distribution at every measurement unit time, the measurement unit time being at least shorter than time required for the sample to pass through the measurement region.

15 Claims, 10 Drawing Sheets

(56) References Cited

U.S. PATENT DOCUMENTS

| | | | |
|---|---|---|---|
| 2009/0297406 A1 | 12/2009 | Okino et al. | |
| 2013/0095004 A1 | 4/2013 | Okino et al. | |
| 2014/0271373 A1 | 9/2014 | Okino et al. | |
| 2015/0276484 A1* | 10/2015 | Matsuzawa | ............ G01N 21/73 |
| | | | 356/316 |

FOREIGN PATENT DOCUMENTS

| | | | | |
|---|---|---|---|---|
| JP | 2791275 B2 * | 8/1998 | ............ | G01B 11/00 |
| JP | 2002005837 | 1/2002 | | |
| JP | 2009229387 | 10/2009 | | |
| JP | 2009229387 A * | 10/2009 | ............ | G01J 3/443 |
| JP | 2012055840 | 3/2012 | | |
| JP | 2014215055 | 11/2014 | | |
| WO | 2006137205 | 12/2006 | | |

\* cited by examiner

INDUCTIVELY COUPLED PLASMA SPECTROMETRIC SYSTEM AND INDUCTIVELY COUPLED PLASMA SPECTROMETRIC METHOD

CROSS-REFERENCE TO RELATED APPLICATION

This application is a U.S. national phase entry of International Application No. PCT/JP2019/043001, filed Nov. 1, 2019, which claims priority to Japanese Patent Application No. 2019-007363, filed Jan. 18, 2019, the entire disclosures of which are incorporated herein by reference.

TECHNICAL FIELD

The present invention relates to an inductively coupled plasma spectrometric system and an inductively coupled plasma spectrometric method.

BACKGROUND ART

In an inductively coupled plasma (ICP) atomic emission spectrometer that uses plasma as an atomization source or an ionization source, an analysis of a sample is performed on the basis of an emission spectrum that is obtained by feeding the sample to a plasma source for plasmaization (excitation) and subjecting light emitted from the plasma to resolution of wavelength.

JP2002/5837A proposes a spectrophotometric analyzer in which the light emitted from the plasma is resolved by a spectrometer, a detection is performed by a plurality of CCD (Charge Coupled Device) photodetectors so as to be associated with positions in the plasma, and on the basis of the detection results, a distribution of emission intensities at every positions in the plasma is detected.

SUMMARY OF INVENTION

However, with the spectrophotometric analyzer proposed in Patent Document 1, there is a problem in that the positions of the sample that supposed to be the analysis target cannot be specified in the plasma, and it is difficult to extract only effects caused by the excitation of the target sample by suitably removing noise (effects caused by excitation of contamination and/or various gas components other than the sample) from the obtained emission intensity distribution.

In light of the above-described circumstances, an object of the present invention is to provide an inductively coupled plasma spectrometric system and an inductively coupled plasma spectrometric method capable of measuring, with higher accuracy, effect caused by a sample that is an analysis target from the light emitted from plasma.

According to an aspect of the present invention, there is provided an inductively coupled plasma spectrometric system configured to measure a light emission state of plasma into which a measurement target sample is fed.

The inductively coupled plasma spectrometric system is provided with: a spectrometer configured to resolve light emitted in a measurement region set in the plasma into a plurality of wavelength components; a detection device configured to detect a spatial distribution of the resolved light; and a measuring device configured to measure the detected spatial distribution at every measurement unit time, the measurement unit time being at least shorter than time required for the sample to pass through the measurement region.

DESCRIPTION OF EMBODIMENTS

Respective embodiments of the present invention will be described below with reference to the drawings, etc.

First Embodiment

A first embodiment will be described below.

Figure 1:
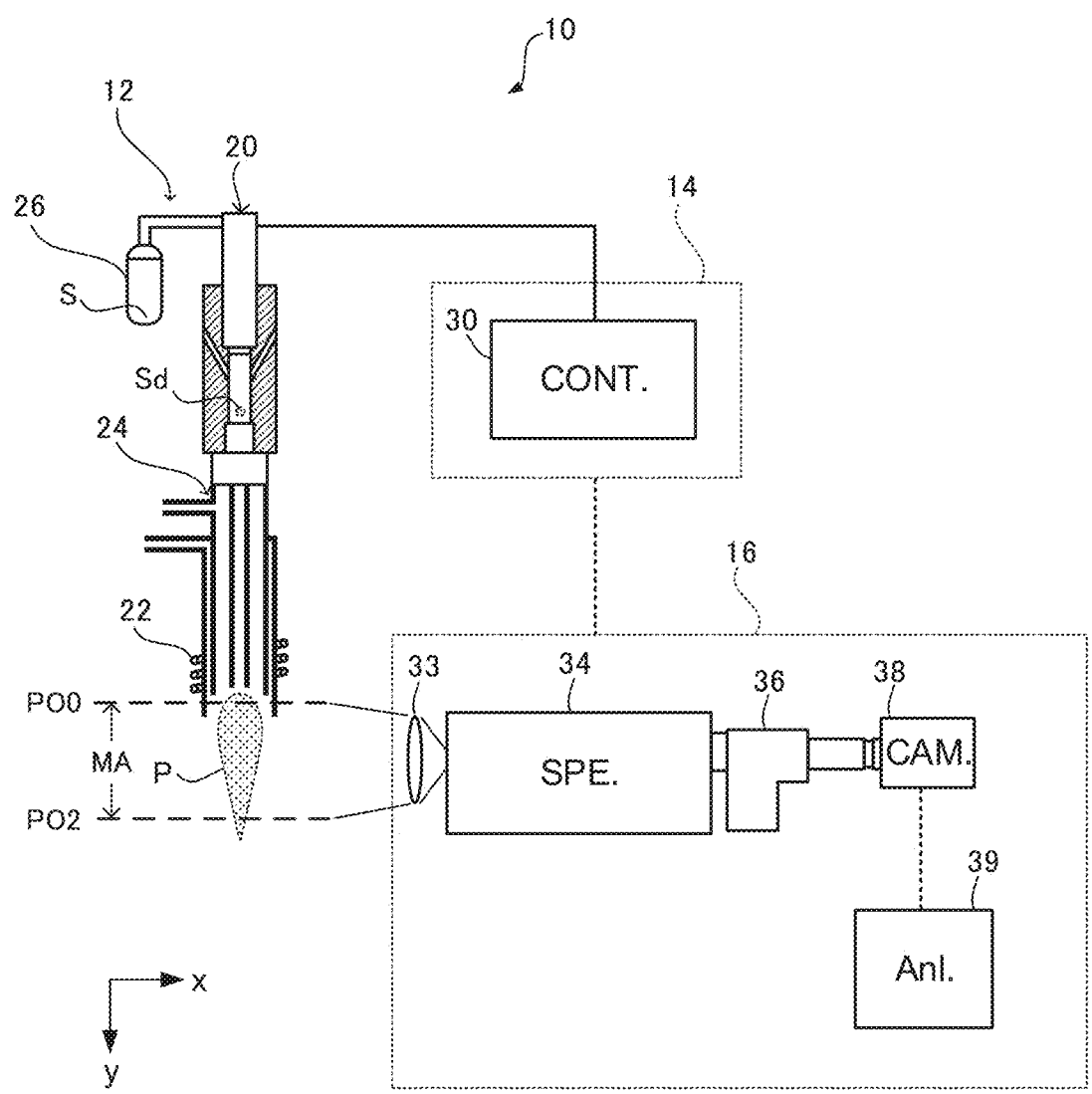
FIG. 1 is a diagram for explaining a configuration of an inductively coupled plasma spectrometric system according to a first embodiment of the present invention.

FIG. 1 is a diagram for explaining a configuration of an inductively coupled plasma spectrometric system 10 according to this embodiment. As shown in the figure, the inductively coupled plasma spectrometric system 10 has a droplet device 12, a sample feed control device 14 and a plasma measuring unit 16.

Figure 2:
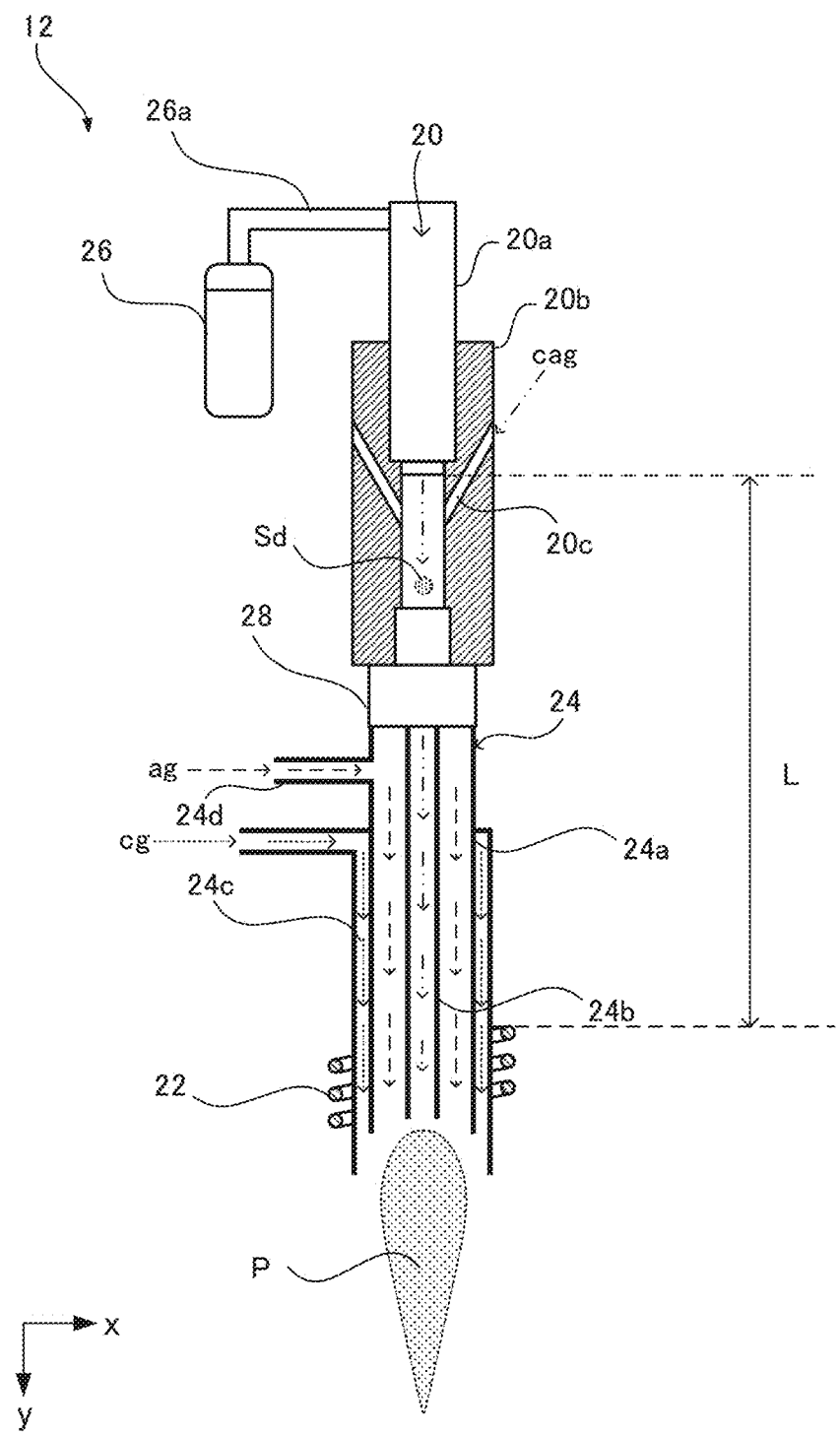
FIG. 2 is a diagram for showing a configuration of a droplet device of this embodiment.

FIG. 2 is a diagram for showing a configuration of the droplet device 12. The droplet device 12 functions as a sample plasma intermittent feeding device that feeds a liquid sample S that is a measurement target to plasma P as a sample droplet Sd. As shown in the figure, the droplet device 12 is provided with a droplet head 20 and a plasma torch 24.

The droplet head 20 functions as a introduction device that introduces the liquid sample S that is the measurement target in a form of the sample droplet Sd. The droplet head 20 is provided with an opening/closing mechanism 20a and a sample guide 20b that are provided in this order from the above in the vertical direction (the negative direction in the Y-axis).

The opening/closing mechanism 20a is connected via a sample feeding capillary 26a to a sample storage container 26 arranged above the droplet device 12. The opening/closing mechanism 20a is opened/closed such that a shut-off state and a communication state for the liquid sample S kept under a negative pressure state in the sample feeding capillary 26a are switched and injects the sample droplet Sd into the sample guide 20b intermittently.

More specifically, the opening/closing mechanism 20a is formed of a piezoelectric element, etc. that is expanded/contracted intermittently so as to feed the sample droplet Sd into the sample guide 20b at a predetermined cycle (for example, several Hz to several ten kHz) by adjusting voltage applied. With such a configuration, the sample that is kept under the negative pressure state in the sample feeding capillary 26a is injected into the sample guide 20b as the sample droplet Sd having a size (diameter) that corresponds to the opening/closing cycle in the opening/closing mechanism 20a.

The sample guide 20b forms a sample passage for guiding the sample droplet Sd that has been injected by the opening/closing mechanism 20a into the direction towards the plasma torch 24. More specifically, the opening/closing mechanism 20a is attached to the sample guide 20b at its upper part, and the sample guide 20b is formed to have a tubular shape within which a space that communicates with an inject port of the opening/closing mechanism 20a for the sample droplet Sd is formed. In addition, career gas introduction channels 20c are provided in a wall portion of the sample guide 20b.

The career gas introduction channels 20c are passages for introducing a career gas cag that guides the sample droplet Sd in the direction towards the plasma P. The career gas introduction channels 20c are each formed so as to have a notch-shape that obliquely intersect with the extending direction of the wall portion of the tubular sample guide 20b (the vertical direction). In other words, the career gas introduction channels 20c have a configuration in which the career gas introduction channels 20c extend obliquely with respect to the wall portion of the sample guide 20b such that the career gas cag has a vertically downward flow direction component in the sample guide 20b.

Therefore, by causing the career gas cag to flow through the career gas introduction channels 20c, it is possible to suitably guide the sample droplet Sd in the sample guide 20b in the direction towards the plasma P by the flow of the career gas cag.

An amount of the career gas cag introduced from the career gas introduction channels 20c can be adjusted appropriately in accordance with factors such as the size (the diameter) of the sample droplet Sd, for example. For example, the volumetric flow rate of the career gas cag can be set so as to fall within a range from 0 to 1 liter/min. In addition, as the career gas cag, it is preferable to use an inert gas from the view point of avoiding an inhibition of a stable generation of the plasma P while achieving the function of guiding the sample droplet Sd to the plasma P, and it is particularly preferable to use the argon gas.

In addition, in the configuration of the droplet device 12 of this embodiment, the plasma P is generated at a lower position in the vertical direction relative to the droplet head 20. Therefore, the sample droplet Sd that has injected into the sample guide 20b from the opening/closing mechanism 20a moves downward towards the plasma P in the vertical direction (in the positive direction in the Y-axis). Therefore, the sample droplet Sd is guided in the direction towards the plasma P due to the action of the gravitational force, and thus, it is possible to suitably make the sample droplet Sd reach the plasma P even without using the career gas cag. Thus, in the configuration of the droplet device 12 of this embodiment, it is also possible to set the volumetric flow rate of the career gas cag so as to fall within a relatively low range (for example, 0 to 0.1 liter/min).

On the other hand, the plasma torch 24 is connected to a lower end of the sample guide 20b via a connector 28. In addition, the plasma torch 24 is provided with a coil 22 as a plasma generation means for generating the plasma P. The plasma torch 24 is provided with supply passages of various gases for performing stable generation of the plasma P and cooling and functions as a guiding passage for guiding the sample droplet Sd from the sample guide 20b to the plasma P.

More specifically, the plasma torch 24 is provided with a torch main body 24a, a sample capillary 24b serving as the sample passage, and a cooling gas supply channel 24c.

The torch main body 24a is connected to the lower end of the sample guide 20b of the droplet head 20 at its upper end via the connector 28. The torch main body 24a is formed to have a substantially cylindrical shape by a material such as quartz, etc., for example, such that the sample capillary 24b is formed inside.

Furthermore, an auxiliary gas introduction tube 24d for introducing an auxiliary gas ag (intermediate gas) for causing the generated plasma P to float below the torch main body 24a is connected to a side wall of the torch main body 24a in the vicinity of the sample guide 20b (a relatively upper region in the vertical direction).

More specifically, the auxiliary gas introduction tube 24d is connected to the torch main body 24a so as to communicate with a space formed between the torch main body 24a and the sample capillary 24b. Therefore, the auxiliary gas ag that is introduced through the auxiliary gas introduction tube 24d flows towards the plasma P through the space formed between the torch main body 24a and the sample capillary 24b.

An amount of the auxiliary gas ag introduced from the auxiliary gas introduction tube 24d can be set arbitrarily from the viewpoint of how far the distance from a lower end of the torch main body 24a to the position of the plasma P generated is to be set (the floating distance of the plasma P). For example, the volumetric flow rate of the auxiliary gas ag can be set so as to fall within a range from 1 to 1.5 liter/min. In addition, as the auxiliary gas ag, it is preferable to use the inert gas having a low reactivity from the view point of avoiding the inhibition of the stable generation of the plasma P while achieving the function of causing the plasma P to float below the torch main body 24a, and it is particularly preferable to use the argon gas.

The sample capillary 24b is provided inside the torch main body 24a so as to extend from the lower end of the sample guide 20b to a lower end of the coil 22. More specifically, the sample capillary 24b communicates with an interior of the sample guide 20b at its upper end via the connector 28 and extends in the vertical direction such that its lower end is positioned in the vicinity of an upper end of the coil 22. In particular, the length of the sample capillary 24b is set so as to be equal to or longer than a predetermined value that is defined from the view point of suppressing an effect of the magnetic field generated by the coil 22 on the droplet head 20. Thus, it is preferable to configure the sample capillary 24b such that the sum of the extended length of the sample guide 20b in the vertical direction and the length of the sample capillary 24b (in other words, a distance L between a lower end of the opening/closing mechanism 20a and the upper end of the coil 22) is about several ten centimeters, for example.

In addition, on an outer circumference of the torch main body 24a below the auxiliary gas introduction tube 24d, the cooling gas supply channel 24c for supplying a cooling gas cg (coolant gas) is formed. The cooling gas cg is a gas that functions as a shielding gas that shields the plasma P from the external air while cooling the torch main body 24a.

In particular, the cooling gas supply channel 24c is formed of a material such as quartz, etc., and is formed to have a tubular shape that covers substantially entire surface of the torch main body 24a in the circumferential direction while ensuring a space through which the cooling gas cg flows between the cooling gas supply channel 24c and the outer circumferential surface of the torch main body 24a. With such a configuration, because the cooling gas cg flows downward in the vertical direction so as to surround the torch main body 24a and the sample capillary 24b provided inside the torch main body 24a from the outer circumference, a cooling function for the torch main body 24a and the sample capillary 24b is achieved. Furthermore, a lower end of the cooling gas supply channel 24c extends downward beyond the lower end of the torch main body 24a in the vertical direction. Thus, the cooling gas cg flows so as to surround the surrounding of the plasma P, and therefore, the function of shielding the plasma P from the external air is suitably realized.

An amount of the cooling gas cg introduced to the cooling gas supply channel 24c can be set arbitrarily by taking a balance with respect to the career gas cag depending on the state of the plasma P. For example, the volumetric flow rate of the cooling gas cg can be set so as to fall within a range from 12 to 15 liter/min. In addition, as the cooling gas cg, it is preferable to use the inert gas having a low reactivity from the view point of avoiding the inhibition of the stable generation of the plasma P while achieving the function of cooling the torch main body 24a and the function of shielding the plasma P, and it is particularly preferable to use the argon gas.

Furthermore, at a position close to a lower end of the plasma torch 24, the coil 22 described above is wound around an outer circumference of the cooling gas supply channel 24c. By receiving a supply of AC electrical power from a power supply device (not shown), the coil 22 generates the magnetic field for generating the plasma P. The plasma P is generated by the action of the magnetic field. By appropriately adjusting a frequency, an amplitude, and so forth of the AC electrical power supplied to the coil 22, the state of the plasma P can be adjusted appropriately.

Next, referring back to FIG. 1, the configurations of the sample feed control device 14 and the plasma measuring unit 16 will be described. The sample feed control device 14 controls the feed of the sample droplet Sd by the droplet device 12. The sample feed control device 14 of this embodiment is formed by a droplet controller 30.

The droplet controller 30 controls introducing timing of the sample droplet Sd by the droplet head 20 (the opening/closing cycle of the opening/closing mechanism 20a). More specifically, the droplet controller 30 adjusts the applied voltage such that the opening/closing mechanism 20a is opened/closed at a desired opening/closing cycle. By doing so, the sample droplet Sd is injected dropwise from the droplet head 20 at a feed-time interval $\Delta Tf$ corresponding to the opening/closing cycle of the opening/closing mechanism 20a.

The plasma measuring unit 16 is provided with a quartz lens 33, a spectrometer 34, an imaging intensifier 36 serving as a detection device, a high speed camera 38, and an image analysis device 39 serving as an image analysis unit.

The quartz lens 33 focuses the light emitted from the plasma P to the spectrometer 34. In particular, the quartz lens 33 is configured so as to focus the light emitted from the plasma P in a region from a measurement start point PO0 to a measurement end point PO2 (hereinafter, also simply referred to as "measurement region MA") to the spectrometer 34.

The spectrometer 34 resolves the light focused by the quartz lens 33 into the light with each wavelength component $\lambda k$ (k=1, 2, 3, etc.). More specifically, the spectrometer 34 images the light focused by the quartz lens 33 such that the wavelength components $\lambda 1$, $\lambda 2$, $\lambda 3$, and so forth are aligned along the y axis direction. The spectrometer 34 is formed of a diffraction grating in accordance with a wavelength resolving power required, for example. It is preferable that the wavelength resolving power of the spectrometer 34 be in $1/100$ nm order, for example, equal to or lower than 0.04 nm.

The imaging intensifier 36 amplifies the light resolved by the spectrometer 34 and generates a spatial distribution of the light. More specifically, the imaging intensifier 36 detects the light resolved by the spectrometer 34 as a two-dimensional image associated with the spatial distribution of a measurement region MA (the position in the vertical direction and the position in the horizontal direction).

The high speed camera 38 functions as image generating unit that generates a time-series image Im (Tu) by performing the image acquisition of the two-dimensional image detected by the imaging intensifier 36. More specifically, the high speed camera 38 generates the time-series images Im (Tu) by continuously performing the image acquisition of the above-described two-dimensional image at every measurement unit time Tu that is set in advance (for example, several ten μs to several hundred μs) and stores the time-series images Im (Tu) as digital data. Therefore, the high speed camera 38 is configured so as to be capable of setting frame rate (for example, several tens of thousands to several hundreds of thousands fps) that allows the continuous image acquisition to be performed at every measurement unit time Tu described above.

In this embodiment, it is preferable that the image-acquisition time interval (the measurement unit time Tu) of the high speed camera 38 be set so as to be sufficiently smaller than the feed-time interval $\Delta Tf$ of the sample droplet Sd (the opening/closing cycle of the opening/closing mechanism 20a). In particular, it is preferable that the image-acquisition time interval (the measurement unit time Tu) of the high speed camera 38 be set so as to be at least shorter than time required for the sample droplet Sd to pass through the measurement region MA (i.e. the time required for the sample droplet Sd to reach the measurement end point PO2 after the entrance into the measurement region MA). Furthermore, it is particularly preferable to set the image-acquisition time interval (the measurement unit time Tu) of the high speed camera 38 such that more than a predetermined number of images of the sample droplet Sd can be acquired during a the course of movement of a single droplet of the sample droplet Sd fed from the droplet device 12 in the measurement region MA. For example, it is possible to set the above-described image-acquisition time interval (the measurement unit time Tu) such that several frames to several hundred frames of images of the sample droplet Sd can be acquired while the sample droplet Sd moves in the measurement region MA. From this view point, for example, it is preferable to set the image-acquisition time interval (the measurement unit time Tu) at about $1/100$ to $1/10000$ of the feed-time interval $\Delta Tf$.

In this embodiment, the generation of the time-series image Im (Tu) by the imaging intensifier 36 and the high speed camera 38 will be described in more detail.

Figure 3:
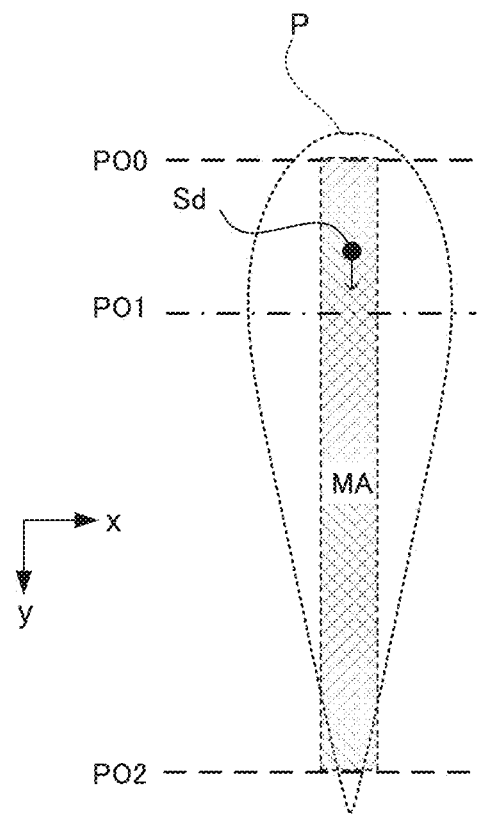
FIG. 3 is a diagram for explaining a measurement region in plasma.

FIG. 3 is a diagram schematically showing the measurement region MA that is set in the plasma P. As shown in the figure, the measurement region MA is set as a region having a width in the horizontal direction and a length in the vertical direction that are arbitrarily set between the measurement start point PO0 and the measurement end point PO2 in the plasma P. FIG. 3 shows, for reference, an emission start point PO1 that is the position in the vertical direction at which the excitation (the light emission) of the sample droplet Sd moving downward in the substantially vertical direction starts.

As shown in the figure, the imaging intensifier 36 can detect, in the measurement region MA, the state of the light on the basis of the spatial distribution consisting of the position of the moving path of the sample droplet Sd (the position in the vertical direction) and the position associated with the wavelength component λk corresponding to the resolving power of the spectrometer 34 (the position in the horizontal direction).

Figure 4:
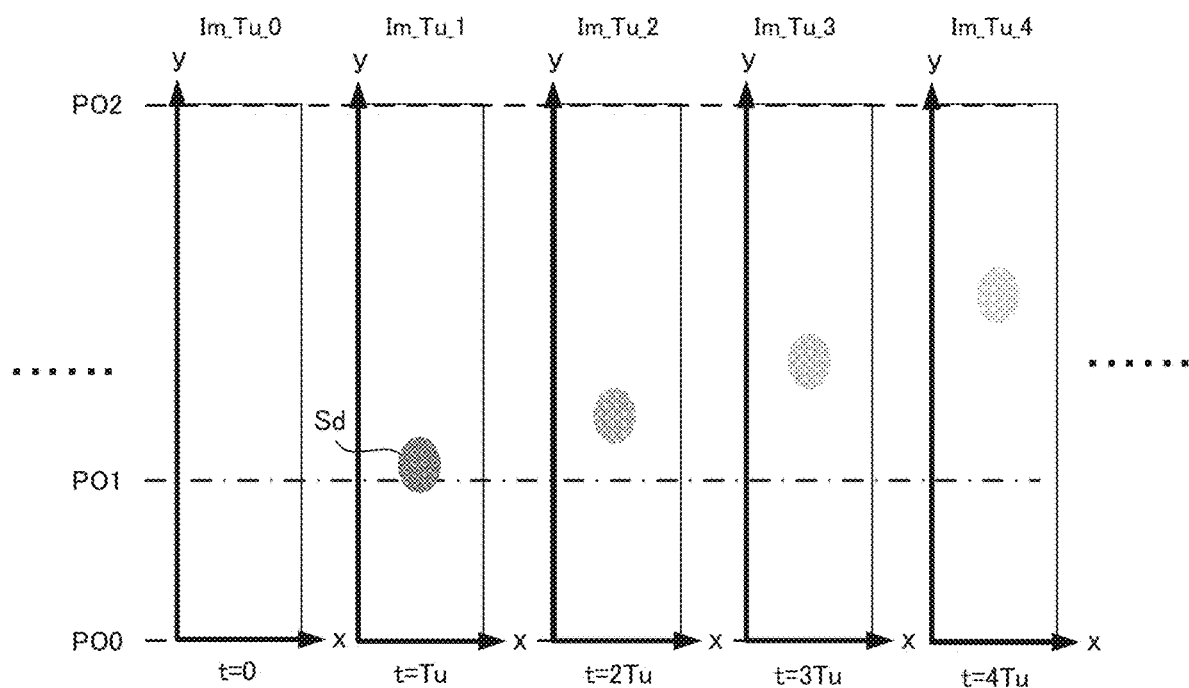
FIG. 4 is a diagram for explaining an example of a time-series image obtained by performing image acquisition of the measurement region in the plasma.

FIG. 4 is a diagram schematically showing an example of the content of the time-series image Im that is generated by the high speed camera 38. In this embodiment, the high speed camera 38 generates a plurality of time-series images Im (five time-series images Im_Tu0 to Im_Tu4 in FIG. 4) at every measurement unit time Tu. In other words, it is possible to respectively assign measurement times t to the time-series images Im acquired at every the measurement unit time Tu in accordance with the order in which the time-series images Im are generated. In addition, the image coordinate in the longitudinal direction in the time-series image Im corresponds to the position in the vertical direction that is the moving path of the sample droplet Sd in the measurement region MA, and the image coordinate in the lateral direction in the time-series image Im corresponds to the position according to the wavelength component λk. Therefore, in the following, the image coordinates in the time-series image Im are expressed by reference signs (x, y) in a similar manner to the vertical direction (the y axis direction) and the horizontal direction (the x axis direction) in the measurement region MA.

Referring back to FIG. 1, the image analysis device 39 functions as the image analysis unit that analyses the respective time-series images Im generated by the high speed camera 38 as the digital data and that obtains a light-intensity distribution Ind (t, x, y) with the measurement time t of the respective time-series images Im according to the measurement unit time Tu and the image coordinate (x, y) on the respective time-series images Im as variables.

Furthermore, the image analysis device 39 may also be configured so as to compute an wavelength-time intensity distribution Ind_1 (t, x) by integrating the light-intensity distribution Ind (t, x, y) over the entire range of the image coordinate y or so as to compute a position-time intensity distribution Ind_2 (t, y) by integrating the light-intensity distribution Ind (t, x, y) in the image coordinate x. Furthermore, the image analysis device 39 may also be configured so as compute a total time intensity distribution Ind_all (t) by integrating the light-intensity distribution Ind (t, x, y) in both of the image coordinate y and the image coordinate x.

In FIG. 1, although an example in which the image analysis device 39 is provided separately from the high speed camera 38 in the inductively coupled plasma spectrometric system 10 is shown, a configuration in which the function of the image analysis device 39 is integrated into the high speed camera 38 may also be possible. Furthermore, the image analysis device 39 may also be configured as an external system that is capable of communicating with the inductively coupled plasma spectrometric system 10 of this embodiment.

According to the inductively coupled plasma spectrometric system 10 of this embodiment described-above, the following operational advantages are provided.

In this embodiment, the inductively coupled plasma spectrometric system 10 that measures the emission state of the plasma P into which the sample S, which is the measurement target (especially, the sample droplet Sd), is fed is provided.

The inductively coupled plasma spectrometric system 10 is provided with: the spectrometer 34 configured to resolve the emitted light in the measurement region MA in the plasma P into the plurality of wavelength components λk; the detection device (the imaging intensifier 36) configured to detect the spatial distribution of the resolved light; and a measuring device (the high speed camera 38 and the image analysis device 39) configured to measure the detected spatial distribution at every measurement unit time Tu, the measurement unit time Tu being at least shorter than the time required for the sample droplet Sd to pass through the measurement region MA.

With the configuration described above, it is possible to measure the emission state of the plasma P to which the effect of the excitation of the sample droplet Sd is reflected from the view point of both the temporal change and the spatial change. Therefore, more information suggesting the change in the emission state of the plasma P due to the effect of the excitation of the sample droplet Sd can be ascertained. Thus, the effect caused by the excitation of the sample droplet Sd in the light emitted from the plasma P can be more suitably separated and extracted from a noise factor, and therefore, it is possible to achieve an improvement in an analytical accuracy in an identification of elemental components in the sample droplet Sd, etc.

In addition, in the inductively coupled plasma spectrometric system 10 of this embodiment, the above-described measuring device includes the image generating unit configured to generate the time-series images Im_Tu by performing the image acquisitions on the above-described spatial distribution at every measurement unit time Tu.

With this configuration, the measurement of the temporal change and the spatial change in the emission state of the plasma P can relatively easily be achieved by a procedure in which the time-series images Im_Tu are generated by continuously performing the image acquisition of the spatial distribution.

Furthermore, with the inductively coupled plasma spectrometric system 10 of this embodiment, the above-described measuring device includes the image analysis device 39 serving as the image analysis unit configured to obtain the light-intensity distribution Ind (t, x, y) by associating the above-described spatial distribution with the image coordinate (x, y) of the time-series image Im_Tu.

With this configuration, it is possible to obtain the light-intensity distribution Ind (t, x, y) including information of both the spatial change (the position of the sample droplet Sd and the wavelength component λk) and the temporal change (the measurement unit time Tu) from the time-series image Im_Tu, and in other words, by performing an image analysis of the time-series image Im_Tu, it is possible to obtain parameters that reflect information of both the spatial change and the temporal change that are useful in an elementary analysis of an unknown sample, etc.

In this embodiment, the above-described detection device is formed of the imaging intensifier 36 configured to detect the above-described spatial distribution as the two-dimensional image while amplifying the light from the spectrometer 34. The above-described image generating unit is formed of the high speed camera 38 capable of setting the frame rate that allows the image acquisition at every measurement unit time Tu.

With this configuration, by using the imaging intensifier 36 and the high speed camera 38 that are already available, the spatial distribution of the light emitted from the plasma P is converted into the two-dimensional image by the imaging intensifier 36, and the image acquisition of the two-dimensional image is performed by the high speed camera 38, and thereby, it is possible to easily achieve the measurement from the view point of both the temporal change and the spatial change described above.

Furthermore, the inductively coupled plasma spectrometric system 10 of this embodiment is provided with the droplet device 12 serving as the sample plasma intermittent feeding device configured to intermittently feed the sample droplet Sd to the plasma P. The measurement unit time Tu is set such that the measurement by the measuring device (in particular, the image acquisition by the high speed camera 38) can be performed more than a predetermined number of times during the course of the movement of a single sample droplet Sd fed from the droplet device 12 in the measurement region MA.

With this configuration, it is possible to more reliably measure the changes over time of the emission state of the plasma P during the course of the movement of the specific sample droplet Sd fed from the droplet device 12 in the measurement region MA. In other words, it is possible to measure the changes over time of the emission state in accordance with the progression of the time for the excitation of the same sample droplet Sd in the measurement region MA. Therefore, it is possible to extract the characteristic of the sample droplet Sd with a higher accuracy from the result of the measurement performed by the measuring device.

In addition, with this configuration, it is possible to suitably observe the changes over time of the emission state of the plasma P caused by the progression of the excitation of the specific sample droplet Sd without employing a complicated configuration or method such as those in which, in order to detect the emission form the plasma P at a plurality of positions, a plurality of the detection devices are provided correspondingly to the plurality of detecting positions, or the measuring timing by the measuring device is changed in accordance with the feed-time interval $\Delta Tf$ of the sample droplet Sd.

In particular, by sufficiently making the measurement unit time Tu shorter than the time between a time point at which the single sample droplet Sd reached the emission start point PO1 of the measurement region MA and a time point at which the further excitation thereof is virtually unobservable, it is possible to suitably measure the changes over time of the emission state of the plasma P on the basis of the progression of the time for the excitation of the same sample droplet Sd without performing a control to synchronize a feeding timing of the sample droplet Sd with a measuring timing at every measurement unit time Tu. As a result, it is possible to achieve simplification of the configuration of the inductively coupled plasma spectrometric system 10.

In addition, this embodiment provides an inductively coupled plasma spectrometric method for measuring the emission state of the plasma P into which the sample droplet Sd, which is a measurement target sample, is fed.

The inductively coupled plasma spectrometric method includes: a step of resolving the light emitted in the measurement region MA set in the plasma P into the plurality of wavelength components $\lambda k$; a step of detecting the spatial distribution of the resolved light; and a step of measuring the detected spatial distribution at every measurement unit time Tu, the measurement unit time Tu being at least shorter than the time required for the sample droplet Sd to pass through the measurement region MA.

With the configuration described above, it is possible to measure the emission state of the plasma P to which the effect of the excitation of the sample droplet Sd is reflected from the view point of both the temporal change and the spatial change. Therefore, more information suggesting the change in the emission state of the plasma P due to the effect of the excitation of the sample droplet Sd can be ascertained. Thus, the effect caused by the excitation of the sample droplet Sd in the light emitted from the plasma P can be more suitably separated and extracted from a noise factor, and therefore, it is possible to achieve an improvement in an analytical accuracy in an identification of elemental components in the sample droplet Sd, etc.

Next, an operational advantages achieved by the droplet device 12 of the inductively coupled plasma spectrometric system 10 of this embodiment will be described in more detail, in contrast to a reference example.

Figure 5:
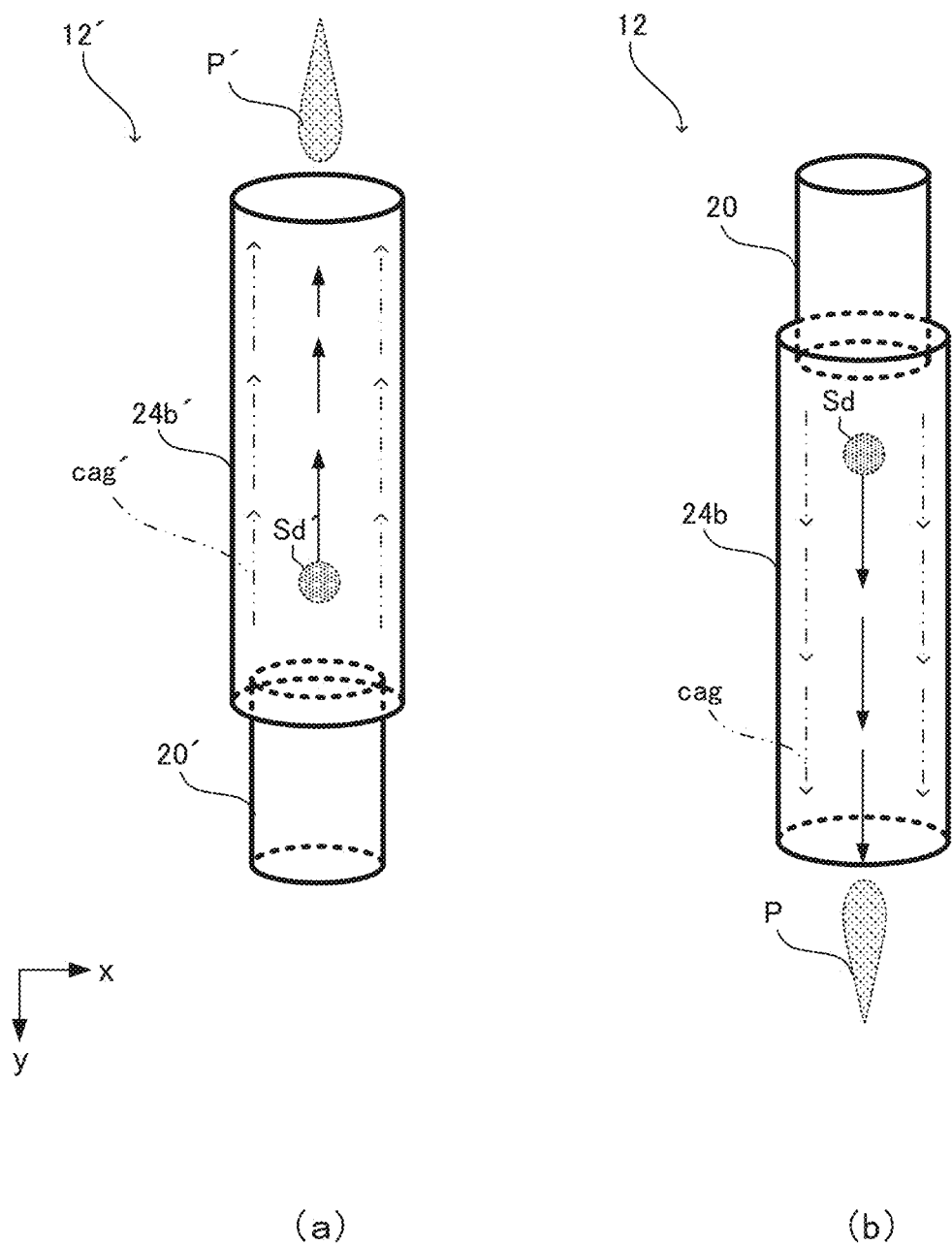
FIG. 5 is a diagram for explaining differences between the droplet device of this embodiment and a reference example.

FIG. 5 is a diagram for explaining operational advantages the droplet device 12 of this embodiment. In particular, FIG. 5(a) is a diagram schematically showing a configuration of the reference example. In addition, FIG. 5(b) is a diagram schematically showing a configuration of the droplet device 12 of this embodiment. In FIG. 5(a), respective configurations of the reference example are expressed by reference signs attached with "' (dash)". In FIG. 5, for the sake of simplification of the drawings and the description, the sample guide 20b in the droplet head 20 described above is omitted.

As shown in the figure, the droplet device 12' in the reference example has a configuration in which the droplet head 20' is arranged at a lower part in the vertical direction and the plasma P is generated at an upper part in the vertical direction. In other words, in the configuration in the reference example, the sample droplet Sd' injected by the droplet head 20' from below is fed via the sample capillary 24b' into the plasma P' that is provided above.

However, with the configuration of the reference example, a stable arrival of the sample droplet Sd' to the plasma P' may be inhibited when a force acting in the direction (the vertical direction) in which the sample droplet Sd' is pushed back due to the gravitational force exceeds a propelling force imparted to the sample droplet Sd' by a guiding action by the career gas cag' in the direction towards the plasma P' (vertically upward direction). In particular, as the sample droplet Sd' moves away from the droplet head 20' and approaches the plasma P' in the sample capillary 24b', the propelling force acting on the sample droplet Sd' in the direction towards the plasma P' is weakened (see solid line arrows in FIG. 5(a)). Thus, the stable arrival to the plasma P' may be inhibited by, for example, displacement of the sample droplet Sd' in the horizontal direction (the positive direction along the x axis), causing the sample droplet Sd' to hit a wall portion of the sample capillary 24b'.

In the above, it is also conceivable to increase the volumetric flow rate of the career gas cag' in order to increase the propelling force imparted to the sample droplet Sd' in the direction towards the plasma P. However, the volumetric flow rate of the career gas cag' also affects the state of the plasma P', and so, if the volumetric flow rate is changed only for increasing the propelling force imparted to the sample droplet Sd' in the direction towards the plasma P', other parameters (the applied voltage to the coil 22, the volumetric flow rate of the cooling gas cg, or the like) also need to be set in order to obtain the desired state of the plasma P', and a complicated operation is required.

Furthermore, there is a case in which it is required to increase the size of the sample droplet Sd' depending on the types of the sample S' that will be the measurement target. In such a case, because it is required to apply greater propelling force in order to make the sample droplet Sd' reach the plasma P' in a stable manner, it becomes more difficult to make the sample droplet Sd' reach the plasma P' in a stable manner.

In contrast, in the droplet device 12 of this embodiment, the sample droplet Sd that has been introduced by the droplet head 20 from the above is fed to the plasma P provided below via the sample capillary 24b. Therefore, the sample droplet Sd is guided to the plasma P by the action of the gravitational force, and it is possible to make the sample droplet Sd reach the plasma P stably regardless of the volumetric flow rate of the career gas cag'.

In particular, because the action of the gravitational force acts uniformly on the sample droplet Sd in any locations in the sample capillary 24b, it is possible to always impart uniform propelling force to the sample droplet Sd in the sample capillary 24b in the direction towards the plasma P (see solid line arrows in FIG. 5(b)). Thus, it is possible to suitably suppress occurrence of factors inhibiting the arrival of the sample droplet Sd to the plasma P, such as the displacement of the sample droplet Sd in the horizontal direction (the x axis direction), for example.

In addition, in the droplet device 12 of this embodiment, as described above, the distance L from the lower end of the opening/closing mechanism 20a to the upper end of the coil 22 is set so as to be equal to or greater than a predetermined value (see FIG. 2). In other words, the sample capillary 24b is formed to have a certain length from the view point of suppressing the effect of the magnetic field generated by the coil 22 exerted on the droplet head 20.

In the above, an example of the effect of the magnetic field generated by the coil 22 exerted on the droplet head 20 includes volatilization of the sample droplet Sd in the vicinity of the opening/closing mechanism 20a that is caused by an action of ionization of the career gas cag in the vicinity of the opening/closing mechanism 20a by the above-described magnetic field. When such a phenomenon occurs, it becomes unable to feed the sample droplet Sd into the plasma P.

On the other hand, in the droplet device 12' of the reference example shown in FIG. 5(a), it may be possible to suppress the above-described volatilization of the sample droplet Sd' in the vicinity of the opening/closing mechanism 20a' by forming the sample capillary 24b' to have a length longer than a certain length. However, in the configuration of the reference example, the propelling force imparted to the sample droplet Sd' in the direction towards the plasma P' is decreased as the sample droplet Sd' moves farther away from the droplet head 20' in the sample capillary 24b'. Thus, if the length of the sample capillary 24b' is increased, the stable arrival of the sample droplet Sd' to the plasma P' will be further inhibited.

In contrast, in this embodiment, while being based on the configuration in which the sample droplet Sd that has been introduced from above by the droplet head 20 is fed into the plasma P below, the length of the sample capillary 24b is configured such that the distance L from the lower end of the opening/closing mechanism 20a to the upper end of the coil 22 becomes equal to or greater than a predetermined value. Thus, regardless of the distance from the droplet head 20, it is possible to suppress the volatilization of the sample droplet Sd in the vicinity of the opening/closing mechanism 20a while maintaining the function of stably feeding the sample droplet Sd to the plasma P by the gravitational force that acts uniformly on the sample droplet Sd.

According to the configuration of the droplet device 12 in the inductively coupled plasma spectrometric system 10 of this embodiment described above, the following operational advantages are provided.

The droplet device 12 of this embodiment is provided with: the droplet head 20 serving as the introduction device configured to introduce the sample droplet Sd; and the plasma torch 24 that is provided with the coil 22 serving as the plasma generation means configured to generate the plasma P, the plasma torch 24 being configured to guide the introduced sample droplet Sd into the plasma P. In the droplet device 12, the droplet head 20 is provided at a upper part of the plasma torch 24, and the coil 22 is provided at a lower part of the plasma torch 24.

According to this configuration, the sample droplet Sd is introduced from the upper part of the plasma torch 24 in the vertical direction via the droplet head 20 and is guided by the action of the gravitational force to the direction towards the plasma P generated by the coil 22 that is provided at the lower part of the plasma torch 24 in the vertical direction. In other words, the movement of the sample droplet Sd that has been injected by the droplet head 20 to the plasma P is promoted by the action of the gravitational force, and therefore, it is possible to make the sample droplet Sd reach the plasma P in a stable manner. Thus, it is possible to suppress variation between the position of the sample droplet Sd moving in the plasma P and a degree of progression of the excitation of the sample droplet Sd. As a result, it is possible to further improve the accuracy of the measurement using the inductively coupled plasma spectrometric system 10 of this embodiment.

In particular, the variation in time between the injection of the single sample droplet Sd by the droplet head 20 and the arrival thereof to the emission start point PO1 is suppressed. Thus, by suitably setting the measurement unit time Tu (the timing for the image acquisition performed by the high speed camera 38) in advance, it is possible to execute the measurement at substantially the same position in the plasma P (the degree of the progression of the excitation) even for the sample droplet Sd that is fed intermittently.

In addition, in the configuration of the droplet device 12 of this embodiment, by utilizing the action of the gravitational force, it is possible to impart the constant propelling force to the sample droplet Sd towards the plasma P regardless of its mass. Thus, it is possible to make the sample droplet Sd reach the plasma P stably even when the size (diameter) of the sample droplet Sd is so large that the stable arrival to the plasma P cannot be achieved only by the guiding action exerted by the career gas cag.

As a result, the size range of the sample droplet Sd applicable to the droplet device 12 can further be increased only by, for example, further increasing a diameter of an aperture for allowing the sample droplet Sd to pass through in the opening/closing mechanism 20a of the droplet head 20, and therefore, it becomes possible to perform the analysis on various substances.

In addition, in the configuration of the droplet device 12 of this embodiment, because the action of guiding the sample droplet Sd to the plasma P is obtained by utilizing the gravitational force, it is possible to reduce the amount of the career gas cag. In other words, although it has conventionally been required to introduce more than certain amount of the career gas cag in order to achieve the function of guiding the sample, by employing the configuration of this embodiment, this function is achieved by the action of the gravitational force, and therefore, it is possible to set the volumetric flow rate of the career gas cag at a lower value.

The volumetric flow rate of the career gas cag is a parameter that affects the state of the plasma P to be generated. In other words, if the volumetric flow rate of the career gas cag can be set freely, the generation of the plasma P becomes easier. As described above, with the configuration of this embodiment, even if the volumetric flow rate of the career gas cag is set at the lower value as described above, the function of guiding the sample droplet Sd into the plasma P is not impaired. Thus, it is possible to set the volumetric flow rate of the career gas cag within a low value range with a relatively greater degree of freedom, and so, it is possible to generate the stable plasma P with ease.

Furthermore, depending on a situation, the sample droplet Sd may also be guided to the plasma P only by the action of the gravitational force without supplying the career gas cag. In this case, for example, by setting the volumetric flow rate of the career gas cag at zero, it is possible to perform the analysis of the sample droplet Sd by feeding the sample droplet Sd into the plasma P without consuming the career gas cag. As a result, because the career gas cag is not supplied, it is possible to reduce the cost for the analysis correspondingly.

In addition, in the droplet device 12 of this embodiment, the distance L from the droplet head 20 to the coil 22 is set so as to be equal to or greater than a predetermined value that is set from the view point of suppressing the effect of the magnetic field generated by the coil 22 exerted on the droplet head 20.

With this configuration, while maintaining the function of stably feeding the sample droplet Sd into the plasma P, it is possible to suppress an adverse effect on the droplet head 20 due to the magnetic field generated by the coil 22 including the volatilization of the sample droplet Sd in the vicinity of the opening/closing mechanism 20a, for example.

Furthermore, in the droplet device 12 of this embodiment, the plasma torch 24 is provided with: the torch main body 24a that is connected to the lower end of the droplet head 20; the sample capillary 24b serving as the sample passage that extends at least over the coil 22 from the lower end of the droplet head 20 in the vertical direction in the torch main body 24a; and the cooling gas supply channel 24c that is formed around the torch main body 24a so as to extend along the extending direction of the sample capillary 24b, the cooling gas supply channel 24c being configured such that the cooling gas cg flows therethrough downwards along the torch main body 24a.

With this configuration, it is possible to suitably cool the torch main body 24a and the sample capillary 24b with the cooling gas cg via the cooling gas supply channel 24c. In particular, because the cooling gas cg flows downward (in other words, in the direction towards the plasma P) in the cooling gas supply channel 24c, it is possible to prevent ascending of the heat from the plasma P with the flow of the cooling gas cg. Therefore, it is possible to more effectively exhibit the cooling effect on the torch main body 24a and the sample capillary 24b.

In addition, in this embodiment, a sample-plasma feeding method executed by the above-described droplet device 12 is provided.

More specifically, in this embodiment, the sample-plasma feeding method including a step of feeding the sample droplet Sd serving as the target sample for the analysis using the inductively coupled plasma into the plasma P via the plasma torch 24 is provided.

In particular, the sample-plasma feeding method includes a step of generating the plasma P at the position lower than the plasma torch 24 and a step of introducing the sample droplet Sd from the position higher than the plasma torch 24.

By doing so, the sample droplet Sd thus introduced is guided to the direction towards the plasma P by the action of the gravitational force. In other words, because the propelling force towards the plasma P is imparted to the sample droplet Sd by the gravitational force, it is possible to make the sample droplet Sd reach the plasma P in a stable manner.

Second Embodiment

A second embodiment will be described below.

Figure 6:
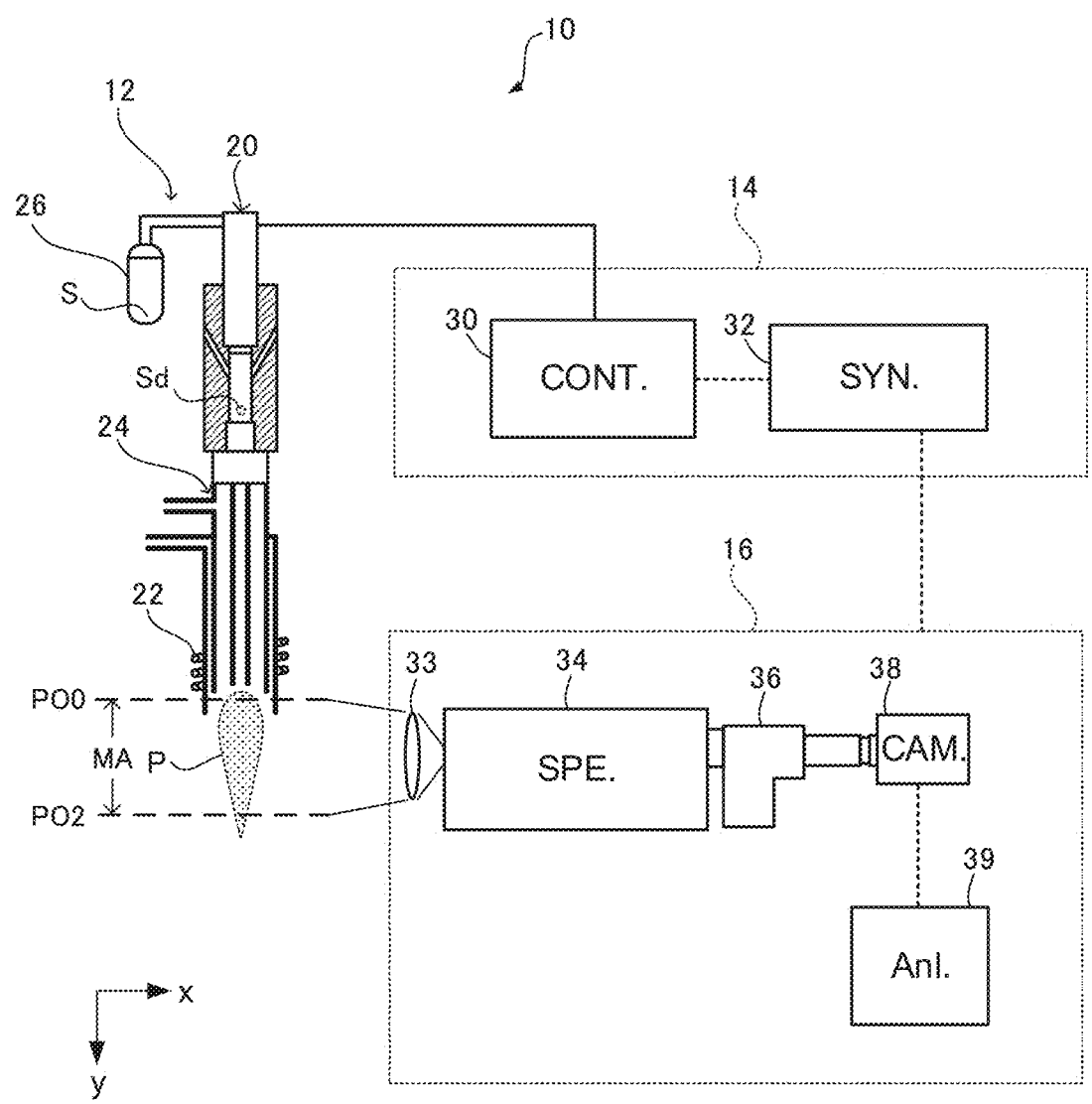
FIG. 6 is a diagram for explaining the configuration of the inductively coupled plasma spectrometric system according to a second embodiment of the present invention.

FIG. 6 is a diagram for explaining the configuration of the inductively coupled plasma spectrometric system 10 according to this embodiment. As shown in the figure, this embodiment differs from the inductively coupled plasma spectrometric system 10 according to the first embodiment in that a pulse generator 32 serving as a synchronizer is provided in the sample feed control device 14.

The pulse generator 32 generates, on the basis of the measurement unit time Tu, a synchronizing signal for synchronizing the feeding timing of the sample droplet Sd from the droplet device 12 with the measuring timing of the emission state of the plasma P (the timing for the image acquisition performed by the high speed camera 38), and the pulse generator 32 outputs this synchronizing signal to the droplet controller 30.

The droplet controller 30 then controls the feeding timing of the sample droplet Sd from the droplet device 12 by opening/closing the opening/closing mechanism 20a at the opening/closing cycle in accordance with the synchronizing signal from the pulse generator 32.

According to the inductively coupled plasma spectrometric system 10 of this embodiment described above, the following operational advantages are provided.

The inductively coupled plasma spectrometric system 10 of this embodiment is further provided with: the synchronizer configured to generate, on the basis of the measurement unit time Tu, the synchronizing signal for synchronizing the feeding timing of the sample droplet Sd from the droplet device 12 with the measuring timing of the emission state of the plasma P; and the droplet controller 30 serving as a feeding-timing control unit configured to control, on the basis of the synchronizing signal, the feeding timing of the sample droplet Sd by the droplet device 12.

With this configuration, it is possible to set the measuring timing such that the emission state of the plasma P to which the effect of the excitation of the sample droplet Sd is reflected after the single sample droplet Sd has reached the emission start point PO1 can be measured with a higher reliability. As a result, it is possible to more reliably measure the changes over time of the emission state of the plasma P in accordance with the progression of the time for the excitation of the same sample droplet Sd.

Although the embodiments of the present invention have been described in the above, the above-mentioned embodiments merely illustrate a part of application examples of the present invention, and the technical scope of the present invention is not intended to be limited to the specific configurations of the above-described embodiments.

For example, in the above-mentioned embodiment, a description has been given of an example in which the time-series image Im is generated by the image generating unit (the high speed camera 38) from the two-dimensional image detected by the detection device (the imaging intensifier 36), and the light-intensity distribution Ind (t, x, y) is obtained by the image analysis unit (the image analysis device 39). However, in the above-described inductively coupled plasma spectrometric system 10, it may also be possible to employ a device in which the image generating unit (the high speed camera 38) is not provided and that measures the light-intensity distribution Ind (t, x, y) directly from the two-dimensional image without generating the time-series image Im.

Furthermore, in the above-mentioned embodiment, a description has been given of an example in which the detection is performed by using the imaging intensifier 36 as the detection device for detecting the spatial distribution of the light from the spectrometer 34 as the two-dimensional image. However, the detection device other than the imaging intensifier 36 may also be used. For example, it may also be possible to employ a configuration in which a device capable of detecting the spatial distribution of the light from the spectrometer 34 as a three-dimensional image is used, and the measurement of the three-dimensional image is performed by the measuring device.

In addition, a description has been given of an example in which the sample droplet Sd is introduced intermittently by the configuration in which the opening/closing mechanism 20a of the droplet head 20 is opened/closed at the desired opening/closing cycle. However, the configuration is not limited thereto, and it may also be possible to employ a configuration in which a solid or gelatinous sample, etc. is fed. In this case, because the sample can be introduced in the form of particles without using the opening/closing mechanism 20a, it may also be possible to employ the droplet head 20 that is provided with, instead of the opening/closing mechanism 20a, any mechanism for introducing the sample particles one by one. Because the solid or gelatinous sample generally has a higher density than the sample droplet Sd, the solid or gelatinous sample tends to have a larger mass for the same size.

Therefore, in the configuration in which the sample is guided by the action of the career gas cag, it is assumed that there is a possibility that the stable arrival to the plasma P is further compromised compared with the case with the sample droplet Sd. In contrast, with the droplet device 12 of the above-mentioned embodiment, because the propelling force in the direction towards the plasma P is imparted to the sample by the action of the gravitational force, it is possible to impart the propelling force to the sample droplet Sd at the same level even with the sample having a relatively large mass such as the solid or gelatinous sample, etc. In other words, even if the sample is the solid or gelatinous sample, it is possible to make the sample reach the plasma P in a stable manner, and to improve the accuracy of the subsequent analysis.

Furthermore, in the above-mentioned embodiment, the droplet device 12 is assumed to have the configuration in which the droplet head 20 is provided on the upper part of the plasma torch 24, and the coil 22 is provided on the lower part of the plasma torch 24 (see FIG. 1 or 6). However, the configuration is not limited thereto, and the inductively coupled plasma spectrometric system 10 may also be configured by employing the above-described sample feed control device 14 and the plasma measuring unit 16 in the droplet device 12' having the configuration in which the droplet head 20' is provided on the lower part of the plasma torch 24' and the coil 22' is provided on the upper part of the plasma torch 24' (see FIG. 5(a)).

In addition, instead of employing the droplet device 12 that intermittently feeds the sample droplet Sd to the plasma P, the inductively coupled plasma spectrometric system 10 may also be configured by employing the above-described sample feed control device 14 and the plasma measuring unit 16 in a sample feeding device that continuously feeds the sample by spraying by a nebulizer, etc. In this case, for example, by setting the measurement unit time Tu so as to be shorter than time required for at least a specific part of the sample being continuously sprayed to pass through the measurement region MA, it is possible to measure the emission state of the plasma P to which the effect of the excitation of the sample is reflected from the view point of both the temporal change and the spatial change.

EXAMPLE

Although the present invention will be described below in more detail with reference to examples and a comparative example, the present invention is not limited to these examples.

Example 1

By using the inductively coupled plasma spectrometric system 10 shown in FIG. 1, the time-series images Im_Tu of the plasma P were generated by using following device and measuring conditions.

Device

The droplet controller 30: MD-K-13070 μm (from microdrop Technologies GmbH)

The spectrometer 34: Shamrock SR-750 (from Andor Technology Ltd)

The imaging intensifier 36: Image Intensifier Unit C10880-13F (from Hamamatsu Photonics K. K.)

The high speed camera 38: FASTCAM Mini AX100540K-M-16 GB (from PHOTRON LIMITED)

Measuring Condition

The sample: a liquid dispersion of metal (Ag) nanoparticles having the average grain size of 2 nm Power supply to the coil 22 (ICP power): 500 w Frame rate of the high speed camera 38: 5000 fps (the measurement unit time Tu: 200 μs)

Figure 7:
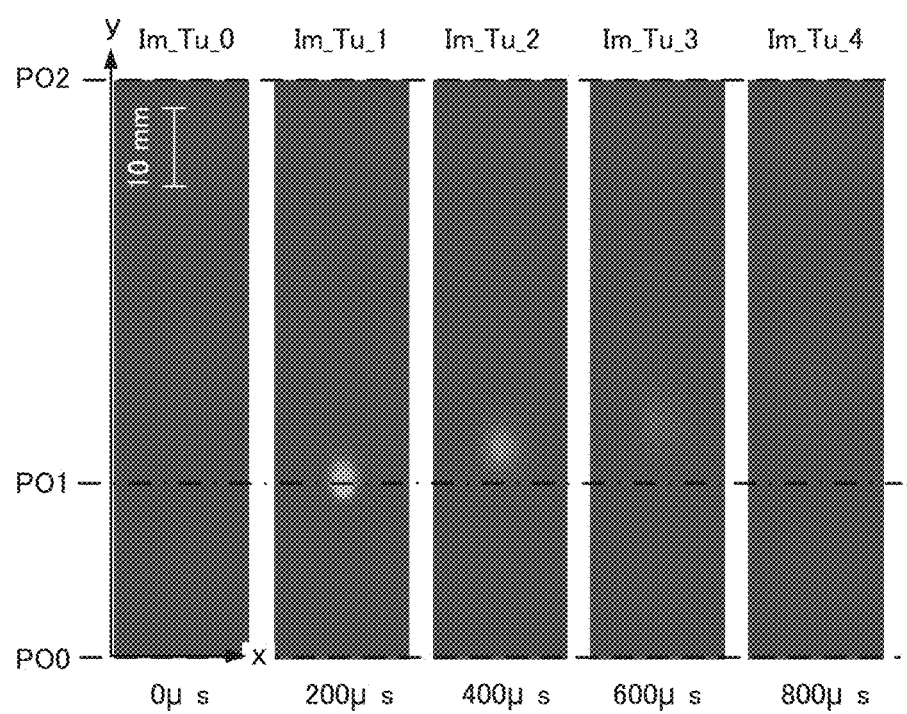
FIG. 7 is a diagram for showing measurement results in Example 1.

The opening/closing cycle of the opening/closing mechanism 20a (droplet frequency): 5 Hz Droplet diameter (the diameter of the aperture of the opening/closing mechanism 20a): 70 μm Among the obtained time-series images Im_Tu of the light emitted from the plasma P, five time-series images Im_Tu0 to Im_Tu4 were extracted at every measurement unit time Tu starting from one measurement unit time Tu before the arrival of the sample droplet Sd to the emission start point PO1. The extracted time-series images Im_Tu0 to Im_Tu4 are shown in FIG. 7.

Results and Discussion

The respective time-series images Im_Tu0 to Im_Tu4 in Example 1 include the distribution of the emission state of the plasma P by the excitation of the sample droplet Sd associated with the image coordinates (x, y) that respectively correspond to spectral wavelength components λk and the positions in the measurement region MA in the vertical direction. The respective time-series images Im_Tu0 to Im_Tu4 represent, in this order, the changes over time at every measurement unit time Tu. Therefore, by referring to the time-series image Im_Tu0 to Im_Tu4, it is possible to ascertain the changes over time and the spatial change of the emission state of the plasma P to which the effect of the excitation of the single sample droplet Sd is reflected.

Example 2

By using the inductively coupled plasma spectrometric system 10 shown in FIG. 1, the light-intensity distribution Ind (t, x, y) of the plasma P is generated by using following device and measuring conditions.

Device

The same as in Example 1

Measuring Condition

Figure 8:
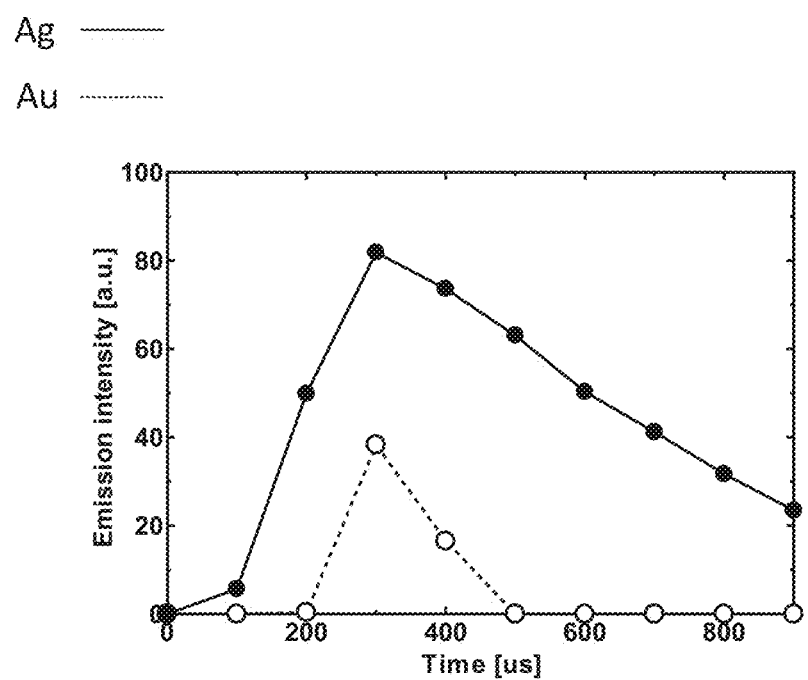
FIG. 8 is a diagram for showing measurement results in Example 2.

The sample: a mixed liquid of Ag nanoparticles (the average grain size: 80 nm) 100 ppm and Au nanoparticles (the average grain size: 20 nm) 10 ppm
Power supply to the coil 22 (ICP power): 500 w
Frame rate of the high speed camera 38: 10000 fps (the measurement unit time Tu: 100 μs)
The opening/closing cycle of the opening/closing mechanism 20a (droplet frequency): 10 Hz
Droplet diameter (the diameter of the aperture of the opening/closing mechanism 20a): 70 μm
Among the obtained time-series images Im_Tu of the light emitted from the plasma P, ten time-series images Im_Tu1 to Im_Tu10 were extracted at every measurement unit time Tu starting from one measurement unit time Tu before the arrival of the sample droplet Sd to the emission start point PO1. The extracted ten time-series images Im_Tu1 to Im_Tu 10 were analyzed with the image analysis device 39 and obtained the light-intensity distribution Ind (t, x, y) associated with the image coordinate (x, y) and the measurement time t. Furthermore, the light-intensity distribution Ind (t, x, y) was resolved into Ag-derived component and Au-derived component, and the total time intensity distribution Ind_all (t)_Ag and Ind_all (t)_Au were computed by integrating the respective components in the image coordinate (x, y). A graph of thus obtained Ind_all (t)_Ag and Ind_all (t)_Au is shown in FIG. 8. In FIG. 8, the solid line shows the total time intensity distribution Ind_all (t)_Ag derived from Ag, and the broken line shows the total time intensity distribution Ind_all (t)_Au derived from Au.

Results and Discussion

In Example 2, the light-intensity distribution Ind (t, x, y) was obtained from the time-series images Im_Tu1 to Im_Tu10 obtained as a result of the measurement on the sample droplet Sd, and it was able to measure the total time intensity distributions Ind_all (t)_Ag and Ind_all (t)_Au for Ag and Au in the sample droplet Sd, respectively, from the light-intensity distribution Ind (t, x, y).

Example 3

By using the inductively coupled plasma spectrometric system 10 shown in FIG. 1, an experiment was conducted for studying variations in timings for the sample droplet Sd to reach the emission start point PO1 after being injected by the opening/closing mechanism 20a by using following device and measuring conditions.

Device

The same as Example 1

Measuring Condition

Figure 9:
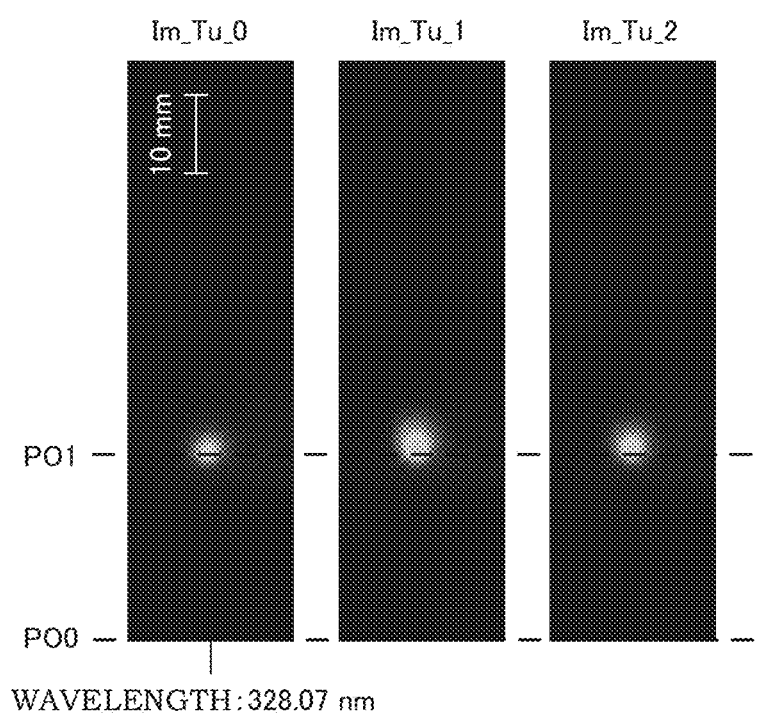
FIG. 9 is a diagram for showing measurement results in Example 3.

The sample: a liquid dispersion of Ag nanoparticles having the average grain size of 2 nm
Power supply to the coil 22 (ICP power): 500 w
Frame rate of the high speed camera 38: 5000 fps (the measurement unit time Tu: 200 μs)
The opening/closing cycle of the opening/closing mechanism 20a (droplet frequency): 10 Hz
Droplet diameter (the diameter of the aperture of the opening/closing mechanism 20a): 70 μm
Among the obtained time-series images Im_Tu of the light emitted from the plasma P, the time-series image Im_Tu_0, the time-series image Im_Tu_1, and the time-series image Im_Tu_2 were extracted. The time-series image Im_Tu_0 corresponds to the timing at which the single sample droplet Sd reached the vicinity of the emission start point PO1, and the time-series image Im_Tu_1 and the time-series image Im_Tu_2 were generated at timings substantially matching respective cycle timings during two cycles of the feeding cycle of the sample droplet Sd since the timing for the time-series image Im_Tu_0. The extracted time-series images Im_Tu_0 to Im_Tu_2 are shown in FIG. 9.

Comparative Example

The inductively coupled plasma emission analysis was executed with the device and the measuring condition in a similar manner as in Examples, except that the droplet device 12' (see FIG. 5(a)) in which, in the droplet device 12 in Examples, respective vertical positions of the droplet head 20 and the coil 22 in the vertical direction were inverted was used.

Figure 10:
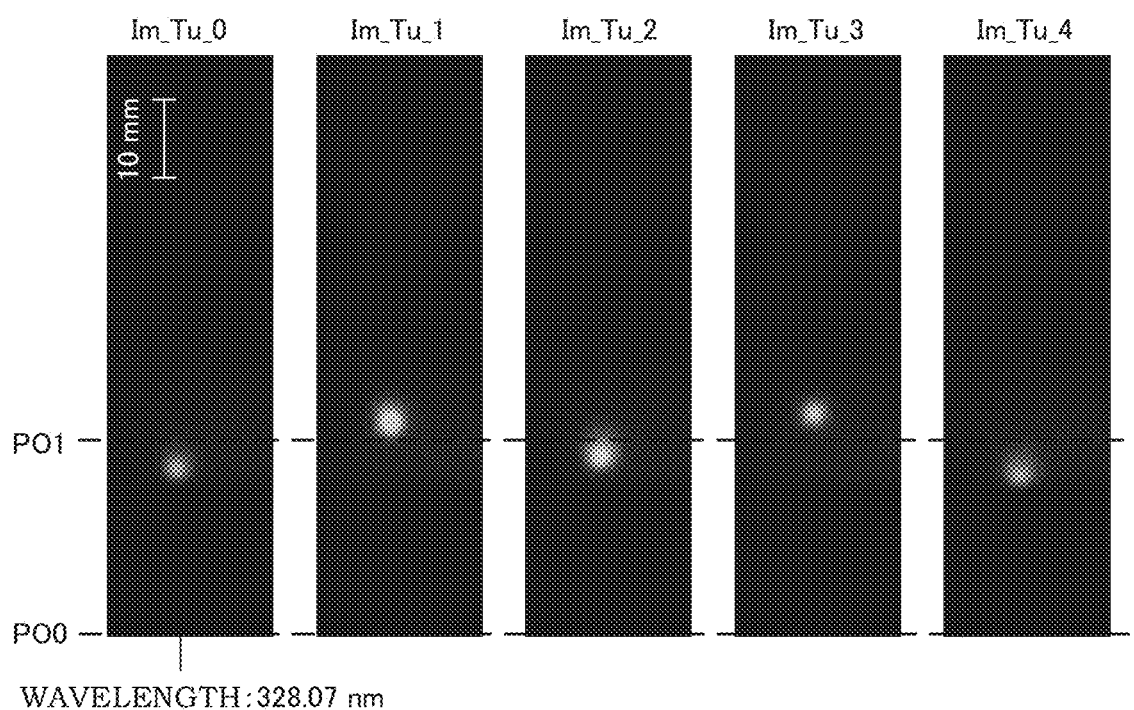
FIG. 10 is a diagram for showing measurement results in a comparative example.

Among the obtained time-series images Im_Tu of the light emitted from the plasma P', the time-series image Im_Tu_0', and the time-series images Im_Tu_1 to Im_Tu_4 are shown in FIG. 10. The time-series image Im_Tu_0' corresponds to the timing at which the single sample droplet Sd' reached the vicinity of the emission start point PO1', and the time-series images Im_Tu_1 to Im_Tu_4 were generated at timings substantially matching respective cycle timings during five cycles of the feeding cycle of the sample droplet Sd since the timing for the time-series image Im_Tu_0.

Results and Discussion

As can be understood from FIG. 10, in the comparative example, in the respective time-series images Im_Tu_1 to Im_Tu_4, it can be seen that variations were caused in the timings for the respective sample droplets Sd' to reach the emission start point PO1'. In other words, it is speculated that this is caused because the sample droplet Sd' was not guided into the plasma P stably.

On the other hand, as can be understood from FIG. 9, in Example 3, in the respective time-series images Im_Tu_0 to Im_Tu_2, the timings at which the respective sample droplets Sd reach the emission start point PO1 substantially match with each other. In other words, in Example 3, it is thought that the sample droplet Sd' is guided into the plasma P more stably than the case in the comparative example.

The present application claims priority to Japanese Patent Application No. 2019-007363, filed in the Japan Patent Office on Jan. 18, 2019. The contents of this application are incorporated herein by reference in their entirety.

The invention claimed is:

1. An inductively coupled plasma spectrometric system configured to measure an emission state of plasma into which a measurement target sample is fed, the inductively coupled plasma spectrometric system comprising:
    a sample feeder configured to intermittently feed the sample to the plasma;
    a spectrometer configured to resolve light emitted in a measurement region set in the plasma into a plurality of wavelength components;
    a detector configured to detect a spatial distribution of the resolved light as a two-dimensional image; and
    an image generator configured to generate time-series images at every measurement unit time during a course of movement of the sample in the measurement region, the measurement unit time being at least shorter than time required for the sample to pass through the measurement region; and
    an analyzer configured to:
        receive the time-series images from the image generator; and
        analyze a characteristic of the sample based on a light-intensity distribution obtained from the time-series images, the light-intensity distribution being a distribution with variables of a wavelength expressed by one component of an image coordinate, and a position of a moving path of the sample expressed by other component of the image coordinate, and a measurement time of the time-series images according to the measurement unit time.

2. The inductively coupled plasma spectrometric system according to claim 1, wherein:
    the detector is formed of an imaging intensifier configured to detect the spatial distribution as the two-dimensional image while amplifying the light resolved by the spectrometer, and
    the image generator is formed of a high speed camera capable of setting a frame rate that allows image acquisition of the two-dimensional image at every measurement unit time.

3. The inductively coupled plasma spectrometric system according to claim 2, further comprising:
    a synchronizer configured to generate, based on the measurement unit time, a synchronizing signal for synchronizing a feeding timing of the sample by the sample feeder with a measuring timing of the emission state of the plasma; and
    a feeding timing controller configured to control, based on the synchronizing signal, the feeding timing of the sample by the sample feeder.

4. The inductively coupled plasma spectrometric system according to claim 1, wherein:
    the sample feeder comprises: an introduction device configured to introduce the sample; and a plasma torch provided with a plasma generator configured to generate the plasma, the plasma torch being configured to guide the introduced sample into the plasma, and
    the introduction device is provided at an upper part of the plasma torch, and the plasma generator is provided at a lower part of the plasma torch.

5. The inductively coupled plasma spectrometric system according to claim 1, wherein:
    the sample is formed as a droplet, a gel, or a solid; and
    the sample feeder feeds the sample to the plasma one by one.

6. The inductively coupled plasma spectrometric system according to claim 1, wherein the sample feeder is arranged above the plasma at a vertical direction of gravity, and the sample is guided to the plasma by gravity.

7. The inductively coupled plasma spectrometric system according to claim 6, wherein the sample feeder comprises a plasma torch that guides the sample introduced from an upper part of the plasma torch to the plasma at a lower part of the plasma torch.

8. The inductively coupled plasma spectrometric system according to claim 1, wherein the sample feeder feeds the sample at a predetermined cycle.

9. An inductively coupled plasma spectrometric method for measuring an emission state of plasma into which a measurement target sample is fed, the inductively coupled plasma spectrometric method comprising:
    intermittently feeding the sample to the plasma,
    resolving light emitted in a measurement region set in the plasma into a plurality of wavelength components;
    detecting a spatial distribution of the resolved light as a two-dimensional image;
    generating time-series images at every measurement unit time during a course of movement of the sample in the measurement region, the measurement unit time being at least shorter than time required for the sample to pass through the measurement region;
    analyzing a characteristic of the sample based on a light-intensity distribution obtained from the time-series images, the light-intensity distribution being a distribution with variables of a wavelength expressed by one component of an image coordinate, and a position of a moving path of the sample expressed by other component of the image coordinate, and a measurement time of the time-series images according to the measurement unit time.

10. An inductively coupled plasma spectrometric system configured to measure an emission state of plasma into which a measurement target sample is fed, the inductively coupled plasma spectrometric system comprising:
    a sample feeder that is arranged above the plasma at a vertical direction of gravity and feeds the sample to the plasma;
    a spectrometer that resolves light emitted in a measurement region set in the plasma into a plurality of wavelength components;
    a camera that is coupled to an output of the spectrometer and obtains time-series images of two-dimensional images of the resolved light at every measurement unit time during a course of movement of the sample in the measurement region, the measurement unit time being at least shorter than time required for the sample to pass through the measurement region; and
    an analyzer that receives data of the time-series images from the camera;
    wherein the analyzer analyzes a characteristic of the sample based on a light-intensity distribution with variables of a wavelength (x), a position (y) of a moving path of the sample, and a measurement time (t) of the time-series images.

11. The inductively coupled plasma spectrometric system according to claim 10, further comprising a pulse generator that is coupled to the sample feeder and the camera, wherein:

the pulse generator generates a synchronizing signal;

the sample feeder begins to feed the sample according to the synchronized signal; and the camera begins to obtain the time-series images of the two-dimensional images according to the synchronized signal.

12. The inductively coupled plasma spectrometric system according to claim 10, wherein the sample is guided to the plasma by gravity.

13. The inductively coupled plasma spectrometric system according to claim 12, wherein the camera obtains time-series images of the two-dimensional images while a piece of the sample is falling in the plasma by gravity, and the position (y) of the moving path of the sample is along the vertical direction of gravity.

14. The inductively coupled plasma spectrometric system according to claim 10, wherein the sample feeder feeds the sample as a droplet, a gel, or a solid.

15. The inductively coupled plasma spectrometric system according to claim 13, wherein the sample feeder feeds the sample as a droplet, a gel, or a solid.

\* \* \* \* \*